(12) United States Patent
Choo et al.

(10) Patent No.: US 8,952,289 B2
(45) Date of Patent: Feb. 10, 2015

(54) LASER CRYSTALLIZATION APPARATUS AND METHOD FOR MANUFACTURING THIN FILM TRANSISTOR ARRAY PANEL USING THE SAME

(71) Applicants: Byoung-Kwon Choo, Yongin (KR); Cheol-Ho Park, Yongin (KR); Kwon-Hyung Lee, Yongin (KR); Sung-Chul Pyo, Yongin (KR)

(72) Inventors: Byoung-Kwon Choo, Yongin (KR); Cheol-Ho Park, Yongin (KR); Kwon-Hyung Lee, Yongin (KR); Sung-Chul Pyo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/761,276

(22) Filed: Feb. 7, 2013

(65) Prior Publication Data
US 2013/0280895 A1  Oct. 24, 2013

(30) Foreign Application Priority Data

Apr. 24, 2012 (KR) ........................ 10-2012-0042651

(51) Int. Cl.
| | | |
|---|---|---|
| *H01L 21/00* | (2006.01) | |
| *H01L 21/67* | (2006.01) | |
| *H01L 21/02* | (2006.01) | |
| *B23K 26/06* | (2014.01) | |

(52) U.S. Cl.
CPC .... *H01L 21/67115* (2013.01); *H01L 21/02675* (2013.01); *H01L 21/02532* (2013.01); *H01L 21/02691* (2013.01); *B23K 26/0656* (2013.01)
USPC ............ 219/121.65; 219/121.78; 219/121.79; 438/166

(58) Field of Classification Search
USPC ................ 438/151–166; 219/121.65, 121.78, 219/121.79
See application file for complete search history.

(56) References Cited

U.S. PATENT DOCUMENTS

2007/0138151 A1*  6/2007  Tanaka et al. ............ 219/121.65

FOREIGN PATENT DOCUMENTS

| JP | 2000-058478 | 2/2000 |
|---|---|---|
| JP | 2004-289140 | 10/2004 |
| JP | 2006-066904 | 3/2006 |
| KR | 10-2005-0065108 A | 6/2005 |
| KR | 10-2007-0052035 A | 5/2007 |
| KR | 10-2012-0024244 A | 3/2012 |
| KR | 10-2012-0111759 A | 10/2012 |

* cited by examiner

*Primary Examiner* — Richard Booth
(74) *Attorney, Agent, or Firm* — Lee & Morse, P.C.

(57) ABSTRACT

Laser crystallization equipment includes a laser generator generating a laser beam, the laser beam being directed toward a processing target substrate, and a blade member over the processing target substrate, the blade member being configured to chop the laser beam with a predetermined width in two directions, wherein two ends of the laser beam chopped by the blade member are irradiated to the processing target substrate as diffraction light.

12 Claims, 6 Drawing Sheets

LASER CRYSTALLIZATION APPARATUS AND METHOD FOR MANUFACTURING THIN FILM TRANSISTOR ARRAY PANEL USING THE SAME

RELATED APPLICATIONS

This application claims priority under 35 U.S.C. §119 to Korean Patent Application No. 10-2012-0042651 filed in the Korean Intellectual Property Office on Apr. 24, 2012, the entire contents of which are incorporated herein by reference.

BACKGROUND

1. Field

Embodiments relate generally to laser crystallization equipment, and a manufacturing method of a thin film transistor array panel using the same.

2. Description of the Related Art

Flat display devices such as an organic light emitting diode (OLED) display and a liquid crystal display (LCD) use a substrate including a thin film transistor.

Particularly, a low temperature polysilicon thin film transistor (LTPS TFT) has excellent carrier mobility such that it is widely used.

The low temperature polysilicon thin film transistor includes an active layer of a polysilicon layer formed by crystallizing an amorphous silicon layer. Methods of crystallizing the amorphous silicon layer include a solid phase crystallization method, an excimer laser crystallization method, and a crystallization method using a metal catalyst.

SUMMARY

Embodiments are directed to laser crystallization equipment including a laser generator generating a laser beam, the laser beam being directed toward a processing target substrate, and a blade member over the processing target substrate, the blade member being configured to chop the laser beam with a predetermined width in two directions, wherein two ends of the laser beam chopped by the blade member are irradiated to the processing target substrate as diffraction light.

The blade member may have a multi-layered structure in which a plurality of blades are overlapped.

A blade that is closer to the processing target substrate among the plurality of blades of the blade member may be relatively protruded in a center direction of the laser beam.

The blade member may be configured such that as a number of the plurality of blades in the blade member is increased, an area where the diffraction light is irradiated to the processing target substrate is relatively decreased.

The laser beam irradiated to the processing target substrate may be a laser slit ray having two ends in a length direction. The blade member may chop both ends of the laser slit ray. The laser slit ray may be an excimer laser slit ray.

The laser crystallization equipment may further include at least one optical member between the laser generator and the blade member.

Embodiments are also directed to a method of manufacturing a thin film transistor array panel, including providing a processing target substrate on which an amorphous silicon thin film is deposited, scanning a laser slit ray to the processing target substrate several times in a direction crossing a length direction of the laser slit ray to irradiate and crystallize the amorphous silicon thin film, wherein the scanning of the laser slit ray is carried out such that edges in the length direction of the laser slit ray are partially overlapped with each other, portions of the processing target substrate corresponding to the edges of the length direction of the laser slit are irradiated two times, and remaining portions of the processing target substrate are irradiated one time, and forming a thin film transistor using the silicon thin film crystallized through the irradiation of the laser slit ray one time as an active layer.

The laser slit ray may be formed by using laser crystallization equipment including a laser generator. A blade member may be disposed over the processing target substrate, the blade member chopping two ends in a length direction of the laser slit ray irradiating the processing target substrate.

The two ends of the laser slit ray chopped by the blade member may be irradiated to the processing target substrate as diffraction light.

The silicon thin film crystallized by irradiating the laser slit ray two times by the partial overlapping of the edges of the length direction of the laser slit ray may be crystallized by the diffraction light.

The laser slit ray may be an excimer laser slit ray.

The blade member may have a multi-layered structure in which a plurality of blades are overlapped.

A blade among a plurality of blades of the blade member that is closer to the processing target substrate may be relatively protruded in a center direction of the laser.

The method may further include relatively decreasing an area where the diffraction light is irradiated to the processing target substrate by increasing a number of the plurality of blades included in the blade member.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
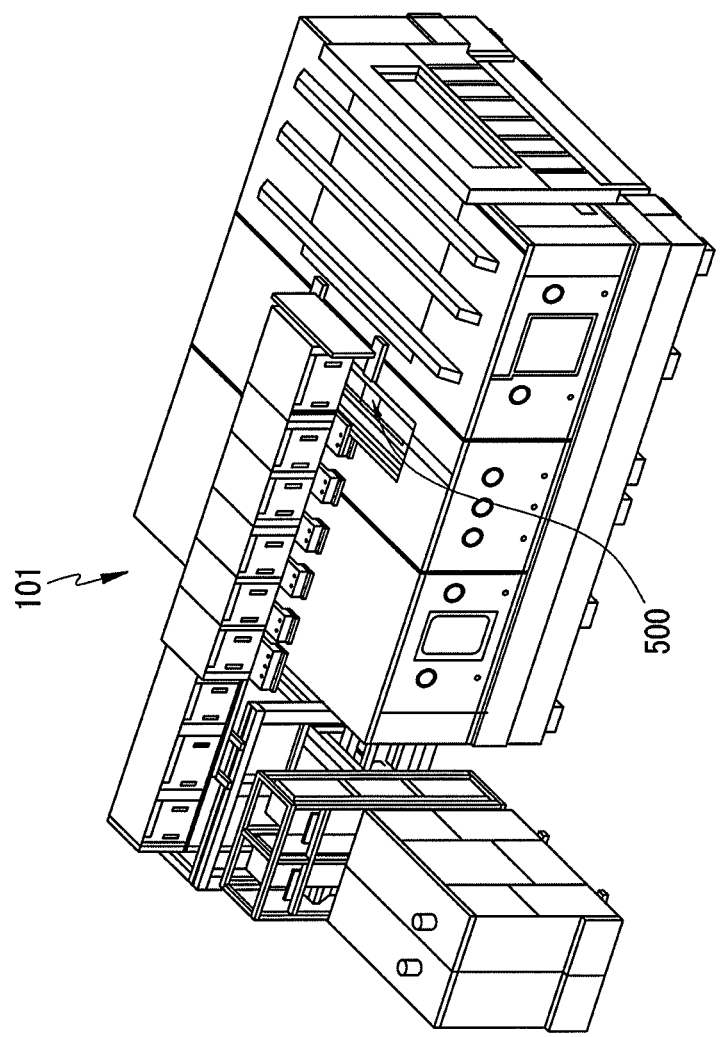
FIG. 1 is a perspective view of laser crystallization equipment according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

The drawings are schematic and are not proportionally scaled. Relative scales and ratios in the drawings may be enlarged or reduced for the purpose of accuracy and convenience, and the scales may be arbitrary such that the embodiments are not limited thereto. In addition, like reference numerals designate like structures, elements, or parts throughout the specification. It will be understood that when an element is referred to as being "on" another element, it can be directly on another element or intervening elements or space may be present therebetween.

Exemplary embodiments views represent ideal exemplary embodiments in detail. Resultantly, various modifications of diagrams are expected. Accordingly, the exemplary embodiments are not limited to specific shapes of shown regions, and for example, also include modifications of the shape by manufacturing.

Next, laser crystallization equipment 101 according to an exemplary embodiment will be described with reference to FIG. 1 to FIG. 6.

Figure 2:
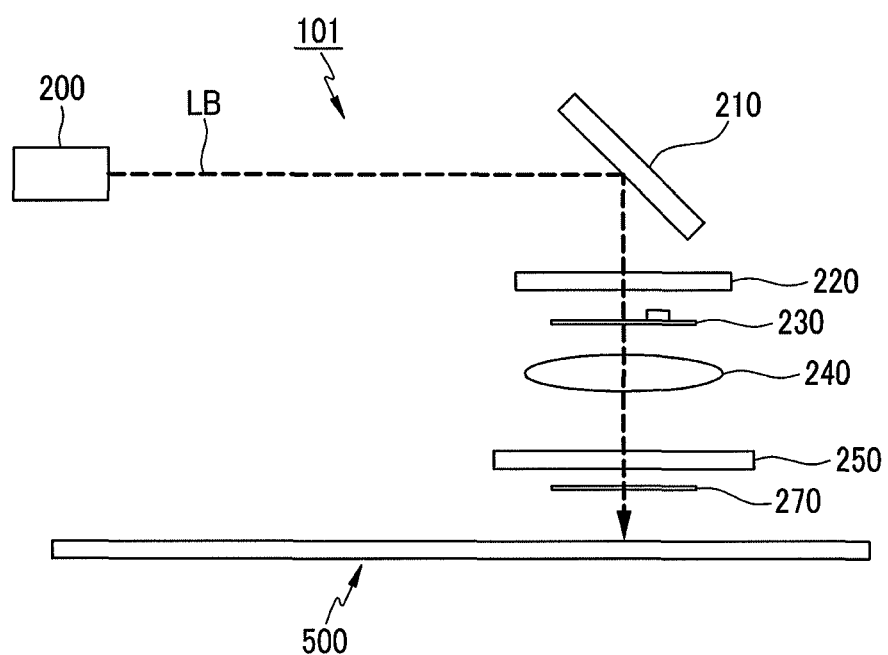
FIG. 2 is a schematic diagram of FIG. 1.

FIG. 1 illustrates one example of laser crystallization equipment 101 according to an exemplary embodiment. FIG. 2 is a schematic diagram of laser crystallization equipment 101 according to an exemplary embodiment. As shown in FIG. 2, a blade member 270 according to an exemplary embodiment is disposed at a position where a laser beam is irradiated to a processing target substrate 500 in the laser crystallization equipment 101.

The laser crystallization equipment 101 according to an exemplary embodiment may include a laser generator 200 and the blade member 270. Also, the laser crystallization equipment 101 may further include at least one of optical members 210, 220, 230, 240, and 250 disposed between the laser generator 200 and the blade member 270.

The laser generator 200 generates a laser beam LB used for the crystallization of the amorphous silicon thin film. In detail, in an exemplary embodiment, the laser generator 200 may generate an excimer laser beam LB.

The processing target substrate 500 has an amorphous silicon thin film to be crystallized.

The optical member may include at least one of a mirror 210 controlling a path of the laser generated in the laser generator 200, a correction lens 220, a light collecting lens 240, a beam blade 230, and an anneal window 250.

The laser beam LB directed toward the processing target substrate 500 through the optical members 210, 220, 230, 240, and 250 may have a slit ray configuration. Hereafter, the laser beam LB is referred to as a laser slit ray LB. The laser slit ray LB is radiated with a long axis direction (see, for example, FIG. 7).

Figure 3:
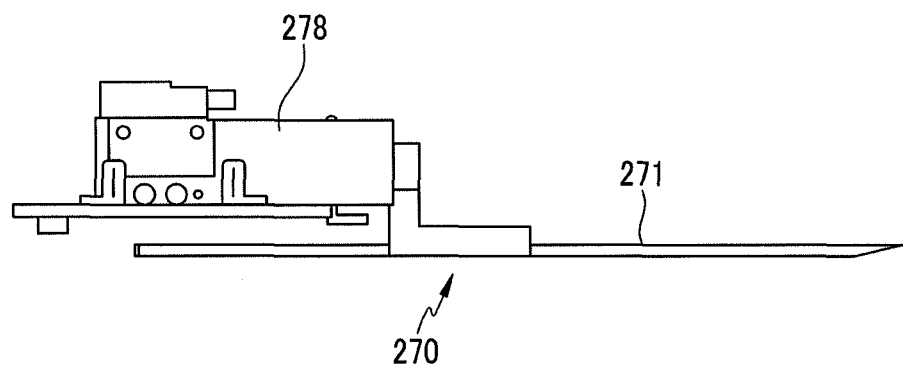
FIG. 3 is a front view of a blade member used in the laser crystallization equipment of FIG. 1.

As shown in FIG. 3, the blade member 270 includes a blade part 271 and a blade supporter 278 supporting the blade portion 271 to be installed. As an example, the blade member 270 may be a stitch blade.

Figure 4:
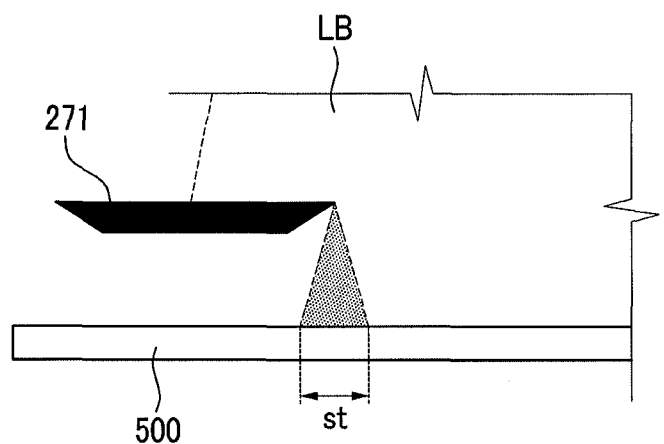
FIG. 4 to FIG. 6 are views showing shape cutting of a laser beam by a blade member in the laser crystallization equipment according to an exemplary embodiment.

Also, as shown in FIG. 4, the blade part 271 of the blade member 270 is disposed over the processing target substrate 500 to direct the laser slit ray LB toward the processing target substrate 500 with a predetermined width in both directions of the laser slit ray LB. In detail, the blade part 271 of the blade member 270 chops both ends of the length direction of the laser slit ray LB. At this time, both ends of the laser slit ray LB chopped by the blade member 270 and irradiated to the processing target substrate 500 become diffraction light. In FIG. 4, the reference character "st" indicates a region where the diffraction light is irradiated.

Figure 5:
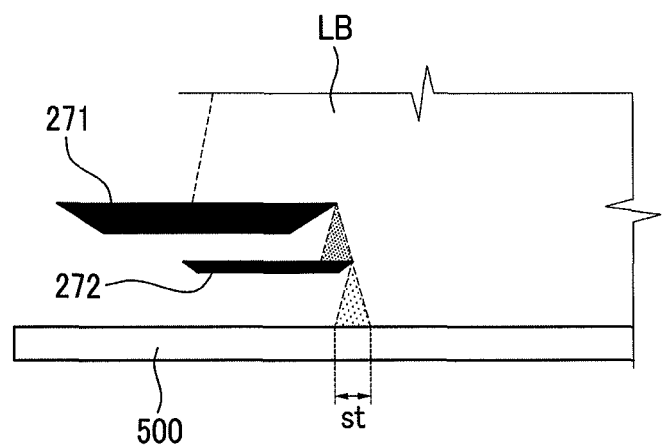
Figure 6:
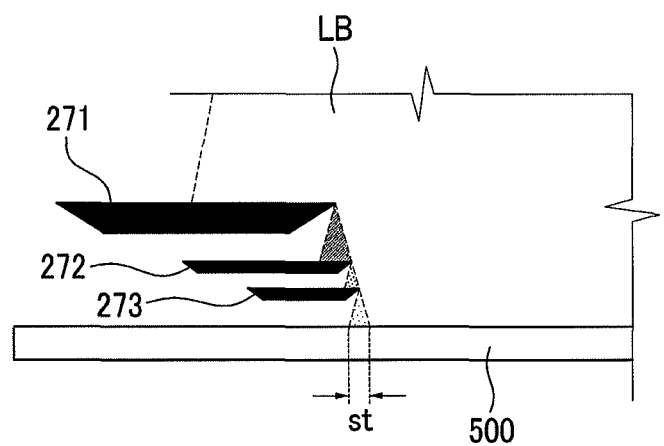

In an exemplary embodiment, the blade member 270 may have a multi-layered structure in which two blades 271 and 272 are disposed to be overlapped or at least three blades 271, 272, and 273 are disposed to be overlapped, as shown in FIG. 5 and FIG. 6. The blade that is disposed closer to the processing target substrate 500 among the plurality of blades 271, 272, and 273 may protrude relatively farther in a center direction of the laser slit ray LB.

In an exemplary embodiment, as shown in FIG. 5 and FIG. 6, as a number of a plurality of blades 271, 272, and 273 included in the blade member 270 is increased, an area (st) where the diffraction light is irradiated to the processing target substrate 500 is relatively decreased. This is because a portion of the diffraction light generated at the end of the blade positioned at an upper layer among the plurality of blades 271, 272, and 273 is blocked by the blade positioned at a lower layer.

By this constitution, the laser crystallization equipment 101 according to an exemplary embodiment may improve the uniformity while crystallizing a silicon thin film by using the excimer laser. Accordingly, the uniformity of the thin film transistors using the crystallized silicon thin film may also be improved.

Next, a manufacturing method of a thin film transistor array panel according to an exemplary embodiment will be described with reference to FIG. 7 and FIG. 8.

Figure 7:
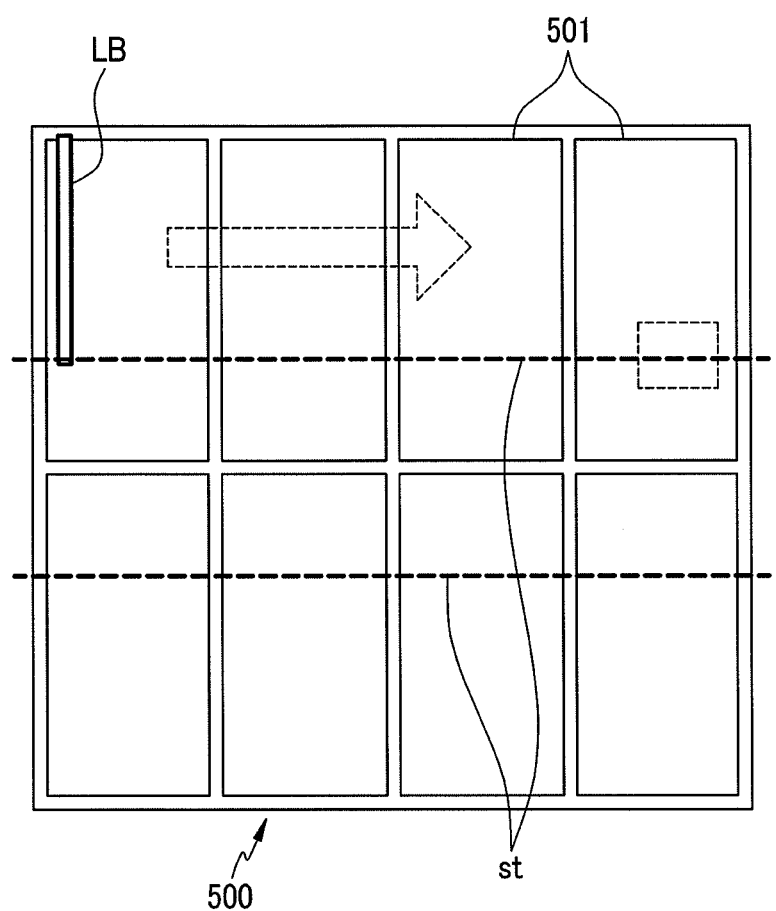
FIG. 7 is a top plan view of a manufacturing process of a thin film transistor array panel according to an exemplary embodiment.

As shown in FIG. 7, a processing target substrate 500 on which an amorphous silicon thin film 501 is deposited is provided. The laser slit ray LB is scanned to the processing target substrate 500 several times in a direction crossing a length direction of the laser slit ray LB so that portions of an edge of the length direction of the laser slit ray LB overlap each other, thereby crystallizing the amorphous silicon thin film 501. The laser slit ray LB is irradiated by using the laser crystallization equipment 101 described with respect to FIG. 1 to FIG. 6.

Accordingly, both ends of the slit ray LB that is chopped by the blade member 270 and are irradiated to the processing target substrate 500 are the diffraction light. The edges of the length direction of the laser slit ray LB are partially overlapped during the scanning of the laser slit ray LB. Thereby, the crystallized silicon thin film in the partially overlapped region is crystallized by the diffraction light through the irradiation of the diffraction light two times. In FIG. 7, the reference character "st" indicates where the diffraction light is irradiated two times through the partial overlapping of the edges of the length direction of the laser slit ray LB.

The laser crystallization equipment 101 according to an exemplary embodiment may not only selectively control the area where the diffraction light is irradiated, but may also minimize the area where the diffraction light is irradiated.

The area st where the diffraction light is irradiated two times to be crystallized has a different crystallization characteristic from the area where the laser slit ray LB is irradiated one time to be crystallized. However, in an exemplary embodiment, the area st where the diffraction light is irradiated two times to be crystallized may be minimized, thereby improving the entire uniformity.

The silicon thin film crystallized through one irradiation of the laser slit ray LB may be used as an active layer to form a thin film transistor. The thin film transistor may have various suitable structures.

Figure 8:
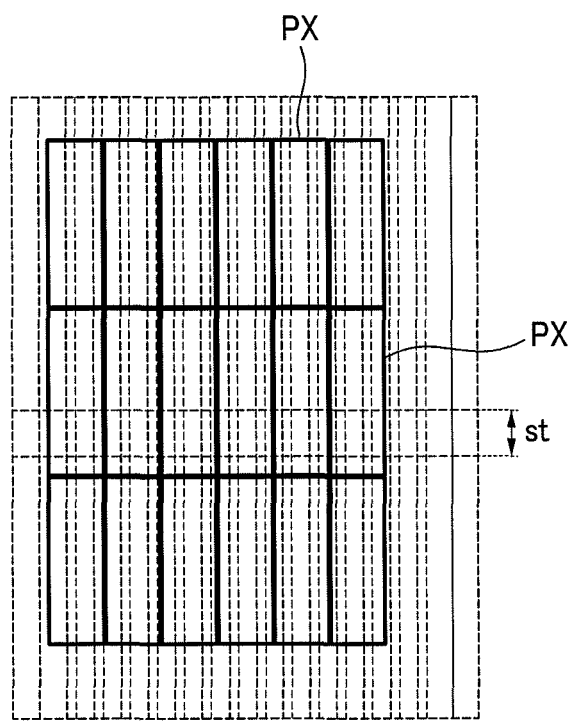
FIG. 8 is a top plan view of an enlarged quadrangle portion indicated by a dotted line of FIG. 7.

FIG. 8 is a top plan view of an enlarged quadrangle portion indicated by a dotted line of FIG. 7.

A reference numeral PX in FIG. 8 represents a pixel area where one pixel is formed. A plurality of thin film transistors are formed in one pixel area (PX). Also, the crystallized silicon thin film is patterned to be used as the active layer of the thin film transistor in an exemplary embodiment. The region st crystallized through the irradiation of the diffraction light two times is not used as the active layer of the thin film transistor, thereby improving the uniformity of the thin film transistor.

Also, according to an exemplary embodiment, the region st crystallized through the irradiation of the diffraction light two times may be minimized such that the silicon thin film crystallized through one irradiation of the laser slit ray LB is relatively easy to use as the active layer.

By the described manufacturing method above, the thin film transistor array panel having a plurality of thin film transistors with the uniform characteristic may be manufactured.

This thin film transistor array panel may be applied to various flat display devices such as an organic light emitting diode (OLED) display and a liquid crystal display (LCD).

By way of summation and review, an excimer laser crystallization method may have advantages in manufacturing a thin film transistor with high performance. However, defects such as Mura-type defects may be generated in an overlapping portion when crystallizing a substrate that is wider than a beam width of a long axis of the laser.

Particularly, to crystallize a substrate of a large size, the laser is scan-irradiated multiple times, and thereby overlapping portions may be generated.

The laser crystallization equipment according to embodiments disclosed herein may improve the uniformity of a silicon thin film crystallized using the excimer laser. Also, the thin film transistor manufacturing method according to an exemplary embodiment may provide a plurality of thin film transistors having uniform characteristics by using the laser crystallization equipment.

While this disclosure has been described in connection with what is presently considered to be practical exemplary embodiments, it is to be understood as being intended to cover various modifications and equivalent arrangements included within the spirit and scope of the appended claims.

What is claimed is:

1. A laser crystallization equipment, comprising:
   a laser generator generating a laser beam, the laser beam being directed toward a processing target substrate; and
   a blade member over the processing target substrate, the blade member being configured to chop the laser beam with a predetermined width in two directions, the blade member having a multi-layered structure in which a plurality of blades are overlapped,
   wherein two ends of the laser beam chopped by the blade member are irradiated to the processing target substrate as diffraction light.

2. The laser crystallization equipment as claimed in claim 1, wherein:
   a blade that is closer to the processing target substrate among the plurality of blades of the blade member is relatively protruded in a center direction of the laser beam.

3. The laser crystallization equipment as claimed in claim 2, wherein:
   the blade member is configured such that as a number of the plurality of blades in the blade member is increased, an area where the diffraction light is irradiated to the processing target substrate is relatively decreased.

4. The laser crystallization equipment as claimed in claim 1, wherein:
   the laser beam irradiated to the processing target substrate is a laser slit ray having two ends in a length direction.

5. The laser crystallization equipment as claimed in claim 4, wherein
   the blade member chops both ends of the laser slit ray.

6. The laser crystallization equipment as claimed in claim 4, wherein:
   the laser slit ray is an excimer laser slit ray.

7. The laser crystallization equipment as claimed in claim 4, further comprising:
   at least one optical member between the laser generator and the blade member.

8. A method of manufacturing a thin film transistor array panel, the method comprising:
   providing a processing target substrate on which an amorphous silicon thin film is deposited;
   scanning a laser slit ray to the processing target substrate several times in a direction crossing a length direction of the laser slit ray to irradiate and crystallize the amorphous silicon thin film, wherein the laser slit ray is formed by the laser crystallization equipment as claimed in claim 1, the scanning of the laser slit ray is carried out such that edges in the length direction of the laser slit ray are partially overlapped with each other, portions of the processing target substrate corresponding to the edges of the length direction of the laser slit are irradiated two times, and remaining portions of the processing target substrate are irradiated one time; and
   forming a thin film transistor using the silicon thin film crystallized through the irradiation of the laser slit ray one time as an active layer.

9. The method as claimed in claim 8, wherein:
   the silicon thin film crystallized by irradiating the laser slit ray two times by the partial overlapping of the edges of the length direction of the laser slit ray is crystallized by the diffraction light.

10. The method as claimed in claim 8, wherein:
    the laser slit ray is an excimer laser slit ray.

11. The method as claimed in claim 8, wherein
    a blade among a plurality of blades of the blade member that is closer to the processing target substrate is relatively protruded in a center direction of the laser.

12. The method as claimed in claim 11, further including relatively decreasing an area where the diffraction light is irradiated to the processing target substrate by increasing a number of the plurality of blades included in the blade member.

* * * * *